US011580797B2

(12) United States Patent
Arechiga Gonzalez et al.

(10) Patent No.: US 11,580,797 B2
(45) Date of Patent: Feb. 14, 2023

(54) SYSTEMS AND METHODS FOR MONITORING SPECIFICATIONS OVER SIMULATION AND TEST DATA

(71) Applicant: TOYOTA RESEARCH INSTITUTE, INC., Los Altos, CA (US)

(72) Inventors: Nikos Arechiga Gonzalez, Los Altos, CA (US); Evangelos Kokkevis, Mountain View, CA (US); Richard Poyner, Acton, MA (US); Daniel Stonier, Lexington, MA (US)

(73) Assignee: TOYOTA RESEARCH INSTITUTE, INC., Los Altos, CA (US)

( * ) Notice: Subject to any disclaimer, the term of this patent is extended or adjusted under 35 U.S.C. 154(b) by 214 days.

(21) Appl. No.: 17/020,701

(22) Filed: Sep. 14, 2020

(65) Prior Publication Data
US 2022/0084332 A1  Mar. 17, 2022

(51) Int. Cl.
*G07C 5/08* (2006.01)
*G06F 30/20* (2020.01)

(52) U.S. Cl.
CPC ........... *G07C 5/0808* (2013.01); *G06F 30/20* (2020.01)

(58) Field of Classification Search
CPC ........ G07C 5/0808; G07C 5/00; G06F 30/20; G06N 99/00
See application file for complete search history.

(56) References Cited

U.S. PATENT DOCUMENTS

| 6,681,383 B1 | 1/2004 | Pastor |
| 2017/0249202 A1* | 8/2017 | Nguyen ............... G06F 11/079 |
| 2018/0286143 A1* | 10/2018 | Deshmukh ............ G07C 5/006 |
| 2019/0340392 A1* | 11/2019 | Khorrami ........... G06F 11/3612 |

FOREIGN PATENT DOCUMENTS

| WO | WO-2007024908 A2 * | 3/2007 | ......... G06F 17/5009 |
| WO | 2011031328 | 3/2011 | |

* cited by examiner

*Primary Examiner* — Joseph J Dallo
(74) *Attorney, Agent, or Firm* — Sheppard, Mullin, Richter & Hampton LLP; Hector A. Agdeppa; Daniel N. Yannuzzi

(57) ABSTRACT

Systems and methods are provided for requirements engineering, and may include: receiving as input, time series data from at least one of a simulation of a vehicle run on a simulation system, or from the vehicle in operation; a requirements monitoring system checking to determine whether a plurality of requirements for operation of the vehicle are met, wherein the requirements are expressed in signal temporal logic form and a requirement includes at least an associated minimal sampling rate and a filtering policy applicable to the requirement; determining a quantitative conformance for each of selected requirements of the plurality of requirements; and add requirements to a verified requirements set based on the qualitative conformance of the requirements.

20 Claims, 8 Drawing Sheets

SYSTEMS AND METHODS FOR MONITORING SPECIFICATIONS OVER SIMULATION AND TEST DATA

TECHNICAL FIELD

The present disclosure relates generally to requirements monitoring, and in particular, some implementations may relate to evaluating simulated or actual vehicle performance in view of specifications.

DESCRIPTION OF RELATED ART

Autonomous vehicle technology is becoming more commonplace with the introduction of new vehicles each model year. While widespread adoption of fully autonomous vehicles is only now becoming visible on the horizon, autonomous vehicle technology is gaining increasing popularity for assisted driving and other semi-autonomous vehicle operation. Developers within organizations such as major original equipment manufacturers, tier 1 suppliers, startup companies and others, are racing to develop autonomous vehicle and advanced driver assistance systems (ADAS) technologies. Such technologies are not limited to autonomous vehicles, but can also be used in robotics and other like applications.

Requirements engineering for autonomous operations is often considered one of the most difficult parts of creating autonomous vehicles. Safe operation of autonomous vehicles at SAE Automation Category Levels 1-5 requires a robust set of requirements to control autonomous operation. Requirements can dictate the behavior of autonomous vehicle systems, and hence the autonomous vehicle, and its interaction with other objects. Requirements can dictate operational characteristics such as, for example, safe following distances from a lead vehicle at various operational states (e.g., remain X meters away from lead vehicle if traveling at speed Y in weather conditions Z), stay within lane markings except when changing lanes or merging (e.g., maintain a distance of X from lane markings), avoid pedestrians, stop for yellow lights, and so on.

During vehicle operation (or simulation), sensor data is used in conjunction with requirements to control the vehicle. Because sensors tend to be noisy, engineers filter out the noise (e.g., by averaging or other signal filtering techniques) to provide a cleaner signal. However, filtering provides a layer of disconnect between the specification in the requirement and the actual data. Too much filtering, for example, can defeat the metric. Consider for example a sensor measuring lateral distance to a lane marking. If the ego vehicle is weaving and as a result moving too close to the lane markings (e.g., violating the specification) this violation might not be detected due to over filtering.

Additionally, these points of manual intervention (e.g., by engineering) can introduce the possibility of error. An engineer is typically required to interpret the requirement drafted in a natural language and to construct a software implementation to implement the requirement. This is often repeated for a full set of requirements, which can be bundled together as a test suite. However, this disconnect between the requirement description and its executable form can introduce points of weakness. For example, this can result in the introduction of error in computed data. As another example, if the input data stream is not sampled frequently enough, this may compromise the evaluation process. As noted above, an engineer writing the executable form of the requirement may choose to filter noisy data coming in from a sensor, which may erroneously also filter out (e.g. smooth away) violations of the requirement. As yet another example, general programming errors may occur. Accordingly, the original requirements might not be implemented in a way that carries out the full intention of such requirements.

BRIEF SUMMARY OF THE DISCLOSURE

Embodiments disclosed herein provide systems and methods for modeling and working with system requirements. In various embodiments, requirements may be configured as first-class software artifacts that are executable and maintainable.

In various embodiments, a method for requirements engineering may include: receiving as input, time series data from at least one of a simulation of a vehicle run on a simulation system, or from the vehicle in operation; a requirements monitoring system checking to determine whether a plurality of requirements for operation of the vehicle are met, wherein the requirements are expressed in signal temporal logic form and a requirement includes at least an associated minimal sampling rate and a filtering policy applicable to the requirement; determining a quantitative conformance for each of selected requirements of the plurality of requirements; and adding requirements to a verified requirements set based on the qualitative conformance of the requirements.

A system for requirements engineering may include: a processor; and a memory coupled to the processor to store instructions, which when executed by the processor, cause the processor to perform operations, the operations comprising: receiving as input, time series data from at least one of a simulation of a vehicle run on a simulation system, or from the vehicle in operation; a requirements monitoring system checking to determine whether a plurality of requirements for operation of the vehicle are met, wherein the requirements are expressed in signal temporal logic form and a requirement includes at least an associated minimal sampling rate and a filtering policy applicable to the requirement; determining a quantitative conformance for each of selected requirements of the plurality of requirements; and adding requirements to a verified requirements set based on the qualitative conformance of the requirements.

The time-series data may include a sequence of values associated with one or more signals generated and monitored over a period of time.

The requirements may be specified in the form of a requirements model, and wherein a requirement of the plurality of requirements may further include a system requirement and a subsystem requirement.

The quantitative conformance may quantify a degree to which performance is met for the selected requirement, a degree to which there is conflict between two or more of the requirements and a degree to which there is conflict between a system requirement and a subsystem requirement.

The method and operations may further include monitoring the quantitative conformance across a plurality of iterations for the selected requirement to optimize the selected requirement based on the quantitative conformance.

The quantitative conformance may quantify a degree to which there is conflict between two or more of the requirements, and wherein determining a quantitative conformance for selected requirements of the plurality of requirements may include applying the requirements over time to a symbolic trace and evaluating to determine whether there may be values that satisfy the requirements.

A system for requirements engineering may include: an operating environment, comprising at least one of a simulation system to simulate operation of a vehicle, a prototype vehicle or a production vehicle to generate time series data regarding actual or simulated vehicle performance; a requirements monitoring module comprising an input to receive time series data from at least one of the simulation system, the prototype vehicle or the actual vehicle; the requirements monitoring module being configured to determine whether a plurality of requirements for operation of the vehicle are met, wherein the requirements are expressed in signal temporal logic form and a requirement includes at least an associated minimal sampling rate and a filtering policy applicable to the requirement; and a solver module to determine a quantitative conformance for each of selected requirements of the plurality of requirements.

A requirement for vehicle performance may include trace specifications and an executable version of a performance requirement, wherein the executable version of the performance requirement is automatically generated from a natural language description of the requirement. The trace specifications may include at least one of a required minimum sampling rate and a filtering specification. The trace specifications and the requirements may be both implemented as first-class objects. The requirement may be implemented as a software entity expressed in a source file that is executable by an interpreter.

Other features and aspects of the disclosed technology will become apparent from the following detailed description, taken in conjunction with the accompanying drawings, which illustrate, by way of example, the features in accordance with embodiments of the disclosed technology. The summary is not intended to limit the scope of any inventions described herein, which are defined solely by the claims attached hereto.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

The figures are not exhaustive and do not limit the present disclosure to the precise form disclosed.

DETAILED DESCRIPTION

Embodiments disclosed herein provide systems and methods for modeling and working with system requirements. In various embodiments, requirements may be configured as first-class software objects that are executable and maintainable. Embodiments may be configured to bundle together several key pieces of information that may be important to fully specifying system requirements, including units, required sampling rates, and filtering procedures. Requirements can be designed, tested, maintained and executed similar to other software entities (i.e., as a first-class software object). Embodiments may be implemented to provide techniques to automatically execute the requirements in the form of monitors over time series data. Because requirements can be executed, they can be tested against various test cases.

An interpreter may be provided to interpret signal temporal logic formulas to automatically monitor requirements without the need for hand-crafted code. This can eliminate what is otherwise a point of manual intervention in conventional solutions. Requirements can be configured to be automatically analyzed by logical analysis tools and can be deployed in simulation and test environments similar to a software update, either on the simulator or on the error detection and handling code of the vehicle.

In contrast, in conventional solutions hierarchical modeling of requirements is carried out in the requirements management software using natural language. In order to evaluate these requirements over test data, an engineer is typically required to interpret the requirements in natural language and write a software implementation of the requirements. This software implementation generally accepts time series data as an input, which may come from a field test or from a simulation. Finally, the implementation of a set of requirements is typically bundled together as a test suite. Thus, there is a requirements description that is disparate from its executable form. This introduces the possibility of error or other issues such as, errors in computed units, improper sampling rate of incoming data, poor choices of filters or sensors that may erroneously smooth away violations of the requirement, and general programming errors. Embodiments may be configured to eliminate the possibility of general programming errors by using an interpreter of signal temporal logic formulas to automatically monitor requirements, without the need for hand-crafted code.

Figure 1:
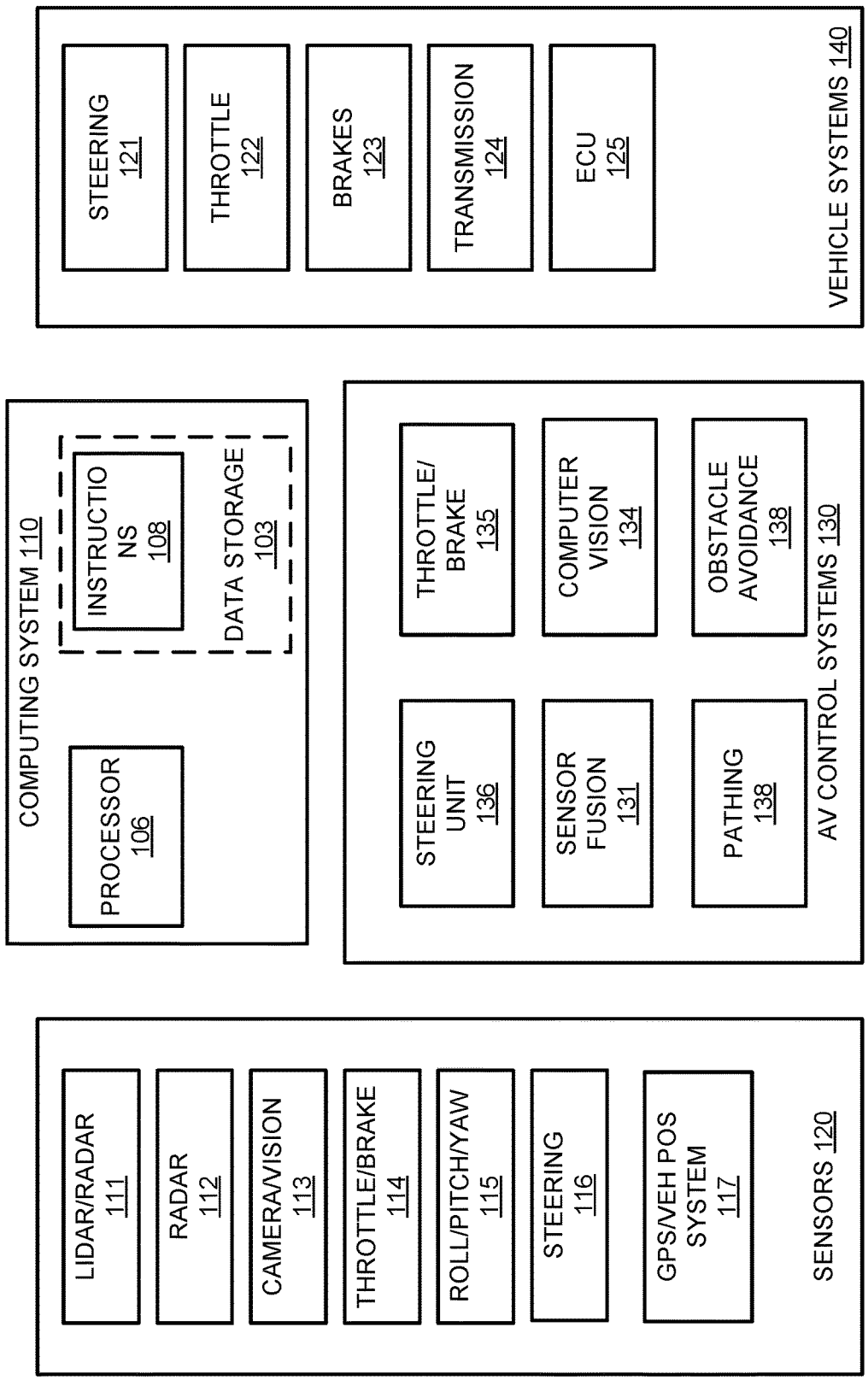
FIG. 1 illustrates an example autonomous or semi-autonomous vehicle with which embodiments of the disclosed technology may be implemented.

FIG. 1 illustrates an example autonomous or semi-autonomous vehicle with which embodiments of the disclosed technology may be implemented. In this example, vehicle 100 includes a computing system 110, sensors 120, AV control systems, 130 and vehicle systems 140. Vehicle 100 may include a greater or fewer quantity of systems and subsystems and each could include multiple elements. Accordingly, one or more of the functions of the technology disclosed herein may be divided into additional functional or physical components, or combined into fewer functional or physical components. Additionally, although the systems and subsystems illustrated in FIG. 1 are shown as being partitioned in a particular way, the functions of vehicle 100 can be partitioned in other ways. For example, various vehicle systems and subsystems can be combined in different ways to share functionality.

Sensors 120 may include a plurality of different sensors to gather data regarding vehicle 100, its operator, its operation and its surrounding environment. In this example, sensors 120 include lidar 111, radar 112, or other like the distance measurement sensors, image sensors 113, throttle and brake sensors 114, 3D accelerometers 115, steering sensors 116, and a GPS or other vehicle positioning system 117. One or more of the sensors 120 may gather data and send that data to the vehicle ECU or other processing unit. Sensors 120 (and other vehicle components) may be duplicated for redundancy.

Distance measuring sensors such as lidar 111, radar 112, IR sensors and other like sensors can be used to gather data to measure distances and closing rates to various external objects such as other vehicles, traffic signs, pedestrians, light poles and other objects. Image sensors 113 can include one or more cameras or other image sensors to capture images of the environment around the vehicle as well as internal to the vehicle. Information from image sensors 113 can be used to determine information about the environment surrounding the vehicle 100 including, for example, information regarding other objects surrounding vehicle 100. For example, image sensors 113 may be able to recognize landmarks or other features (including, e.g., street signs, traffic lights, etc.), slope of the road, lines on the road, curbs, objects to be avoided (e.g., other vehicles, pedestrians, bicyclists, etc.) and other landmarks or features. Information from image sensors 113 can be used in conjunction with other information such as map data or information from positioning system 117 to determine, refine or verify vehicle location.

Throttle and brake sensors 114 can be used to gather data regarding throttle and brake application by a human or autonomous operator. Accelerometers 115 may include a 3D accelerometer to measure roll, pitch and yaw of the vehicle. Accelerometers 115 may include any combination of accelerometers and gyroscopes for the vehicle or any of a number of systems or subsystems within the vehicle to sense position and orientation changes based on inertia.

Steering sensors 116 (e.g., such as a steering angle sensor) can be included to gather data regarding steering input for the vehicle by a human or autonomous operator. A steering sensor may include a position encoder monitor the angle of the steering input in degrees. Analog sensors may collect voltage differences that can be used to determine information about the angle and turn direction, while digital sensors may use an LED or other light source to detect the angle of the steering input. A steering sensor may also provide information on how rapidly the steering wheel is being turned. A steering wheel being turned quickly is generally normal during low-vehicle-speed operation and generally unusual at highway speeds. If the driver is turning the wheel at a fast rate while driving at highway speeds the vehicle computing system may interpret that as an indication that the vehicle is out of control. Steering sensor 116 may also include a steering torque sensor to detect an amount of force the driver is applying to the steering wheel.

Vehicle positioning system 117 (e.g., GPS or other positioning system) can be used to gather position information about a current location of the vehicle as well as other positioning or navigation information.

Although not illustrated, other sensors 120 may be provided as well. Various sensors 120 may be used to provide input to computing system 110 and other systems of vehicle 100 so that the systems have information useful to operate in an autonomous, semi-autonomous or manual mode.

AV control systems 130 may include a plurality of different systems/subsystems to control operation of vehicle 100. In this example, AV control systems 130 include steering unit 136, throttle and brake control unit 135, sensor fusion module 131, computer vision module 134, pathing module 138, and obstacle avoidance module 139. Sensor fusion module 131 can be included to evaluate data from a plurality of sensors, including sensors 120. Sensor fusion module 131 may use computing system 110 or its own computing system to execute algorithms to assess inputs from the various sensors.

Throttle and brake control unit 135 can be used to control actuation of throttle and braking mechanisms of the vehicle to accelerate, slow down, stop or otherwise adjust the speed of the vehicle. For example, the throttle unit can control the operating speed of the engine or motor used to provide motive power for the vehicle. Likewise, the brake unit can be used to actuate brakes (e.g, disk, drum, etc.) or engage regenerative braking (e.g., such as in a hybrid or electric vehicle) to slow or stop the vehicle.

Steering unit 136 may include any of a number of different mechanisms to control or alter the heading of the vehicle. For example, steering unit 136 may include the appropriate control mechanisms to adjust the orientation of the front or rear wheels of the vehicle to accomplish changes in direction of the vehicle during operation. Electronic, hydraulic, mechanical or other steering mechanisms may be controlled by steering unit 136.

Computer vision module 134 may be included to process image data (e.g., image data captured from image sensors 113, or other image data) to evaluate the environment within or surrounding the vehicle. For example, algorithms operating as part of computer vision module 134 can evaluate still or moving images to determine features and landmarks (e.g., road signs, traffic lights, lane markings and other road boundaries, etc.), obstacles (e.g., pedestrians, bicyclists, other vehicles, other obstructions in the path of the subject vehicle) and other objects. The system can include video tracking and other algorithms to recognize objects such as the foregoing, estimate their speed, map the surroundings, and so on.

Pathing module 138 may be included to compute a desired path for vehicle 100 based on input from various other sensors and systems. For example, pathing module 138 can use information from positioning system 117, sensor fusion module 131, computer vision module 134, obstacle avoidance module 139 (described below) and other systems to determine a safe path to navigate the vehicle along a segment of a desired route. Pathing module 138 may also be configured to dynamically update the vehicle path as real-time information is received from sensors 120 and other control systems 130.

Obstacle avoidance module 139 can be included to determine control inputs necessary to avoid obstacles detected by sensors 120 or AV control systems 130. Obstacle avoidance module 139 can work in conjunction with pathing module 138 to determine an appropriate path to avoid a detected obstacle.

Vehicle systems 140 may include a plurality of different systems/subsystems to control operation of vehicle 100. In this example, AV control systems 130 include steering system 121, throttle system 122, brakes 123, transmission went 24, electronic control unit (ECU) 125 and propulsion system 126. These vehicle systems 140 may be controlled by AV control systems 130 in autonomous, semi-autonomous or manual mode. For example, in autonomous or semi-autonomous mode, AV control systems 130, alone or in conjunction with other systems, can control vehicle systems 140 to operate the vehicle in a fully or semi-autonomous fashion. This may also include an assist mode in which the vehicle takes over partial control or activates ADAS controls to assist the driver with vehicle operation.

Computing system 110 in the illustrated example includes a processor 106, and memory 103. Some or all of the functions of vehicle 100 may be controlled by computing system 110. Processor 106 can include one or more GPUs, CPUs, microprocessors or any other suitable processing system. Processor 106 may include one or more single core or multicore processors. Processor 106 executes instructions 108 stored in a non-transitory computer readable medium, such as memory 103.

Memory 103 may contain instructions (e.g., program logic) executable by processor 106 to execute various functions of vehicle 100, including those of vehicle systems and subsystems. Memory 103 may contain additional instructions as well, including instructions to transmit data to, receive data from, interact with, and/or control one or more of the sensors 120, AV control systems, 130 and vehicle systems 140. In addition to the instructions, memory 103 may store data and other information used by the vehicle and its systems and subsystems for operation, including operation of vehicle 100 in the autonomous, semi-autonomous or manual modes.

Although one computing system 110 is illustrated in FIG. 1, in various embodiments multiple computing systems 110 can be included. Additionally, one or more systems and subsystems of vehicle 100 can include its own dedicated or shared computing system 110, or a variant thereof. Accordingly, although computing system 110 is illustrated as a discrete computing system, this is for ease of illustration only, and computing system 110 can be distributed among various vehicle systems or components.

Vehicle 100 may also include a wireless communication system (not illustrated) to communicate with other vehicles, infrastructure elements, cloud components and other external entities using any of a number of communication protocols including, for example, V2V, V2I and V2X protocols. Such a wireless communication system may allow vehicle 100 to receive information from other objects including, for example, map data, data regarding infrastructure elements, data regarding operation and intention of surrounding vehicles, and so on. A wireless communication system may also allow vehicle 100 to transmit information to other objects. In some applications, computing functions for various embodiments disclosed herein may be performed entirely on computing system 110, distributed among two or more computing systems 110 of vehicle 100, performed on a cloud-based platform, performed on an edge-based platform, or performed on a combination of the foregoing.

The example of FIG. 1 is provided for illustration purposes only as one example of vehicle systems with which embodiments of the disclosed technology may be implemented. One of ordinary skill in the art reading this description will understand how the disclosed embodiments can be implemented with this and other vehicle or platforms and with other robots.

The example of FIG. 1 is are provided for illustration purposes only as examples of vehicle systems with which embodiments of the disclosed technology may be implemented. One of ordinary skill in the art reading this description will understand how the disclosed embodiments can be implemented with vehicle platforms.

Figure 2:
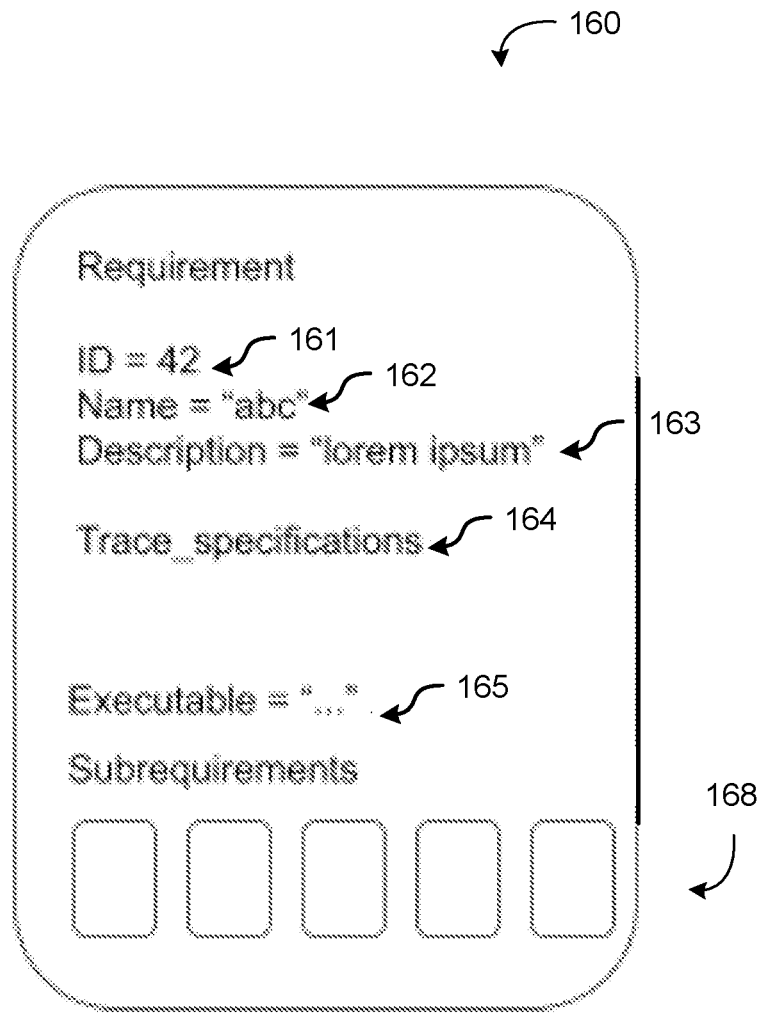
FIG. 2 illustrates an example of a requirement in accordance with various embodiments.

FIG. 2 illustrates an example of a requirement in accordance with various embodiments. In this example, the requirement 160 may be identified by an ID 161 and a name 162, it may further include a description 163 of the requirement 160. In various embodiments, a requirement 160 may further include a trace specification 164, a required minimum sampling rate, units for signals, filtering specifications, and sub requirements 168. A plurality of requirements 160 may be grouped together to form a suite of requirements. In the case of a simulation, testing or prototype operations, this may be referred to as a test suite. These requirements can be used throughout all stages of vehicle life, including from prototyping and testing through actual operation of the vehicle.

A requirement may be configured to express properties or behavior of the system, which might be implemented as a mixed combination of hardware and software. These properties may relate to a software state for the system (e.g., stop at a stop sign, stop at yellow lights) or continuous items (e.g., maintaining a desired speed or a desired following distance). Information can be gathered using signal temporal logic (STL), which supports mixed signals and enables a robust this metric that indicates how far an ego vehicle is from satisfying the specified requirement.

Trace specifications 164 may be included for the requirement 160 as well. Trace specifications can specify, for example, requirement specification such as a minimal sampling rate and filtering policy for each time series in the trace or log data. This example further includes an executable version of the requirement 165, which may be expressed in STL with units. Embodiments may be implemented in which the executable is automatically generated from a natural language description of the requirement. For example, the natural language specification might state "Always stay in your lane and provide updates every 20 Hz," from which an executable is automatically generated to implement the rule. The executable may be configured to implement the requirement in accordance with trace specifications.

To check the units, when the data is received (e.g., from a test or simulation), the system checks to determine whether the signals have the same units as the requirement. For example, consider a situation in which the requirement specifies that the vehicle must keep within 0.1 meters of the lane boundary. At this stage, the system can be configured to check whether the distance from the lane boundary from the data is given in meters. To check the sampling rate, the system checks the timestamps between the different measurements of each signal. Consider the above example in which the requirement specifies that updates must be provided every 20 Hz. At this stage the system checks to determine whether the distance to the lane boundary has timestamps that happen at 20 Hz or more frequently.

Before checking the STL formulas (e.g., trace specifications), the system may be configured to apply the filters specified by the requirement to the incoming data. However, if the filters are implemented such that they are too aggressive, the system may miss an event in which the vehicle violated its requirement (i.e., briefly crossed the lane boundary). On the other hand, if the filters are not aggressive enough, the noise in the system (e.g., from the sensors or other sources) may create spurious violations (false positives) because noise on the vehicle position may make it appear that the car oscillates across lane boundaries very quickly.

The system can now be configured to check the STL formulas that make up trace specifications. STL formulas may be provided in two different types, static and temporal. Because in some embodiments the STL formulas are provided as a_formal_language, similar to a very simple programming language, the system can be configured to interpret them in a similar way that a system would interpret any other machine-understandable language.

Static formulas may be evaluated at each snapshot of time, and they do not specify behavior in terms of the future or the past. For example, "stay within 0.1 meters from the lane boundary" would be expressed as an STL formula as "(left_boundary<car_positition−0.1) AND (car_position+ 0.1>right_boundary)". To evaluate this formula, the interpreter may be configured to step through each data point in the log data, plug in the values of left_boundary, car_position, and right_boundary, and check to determine whether the result is "TRUE". At each time step, the interpreter produces a value of TRUE or FALSE. The interpreter may be implemented to support basic arithmetic operators (addition, subtraction, multiplication, division), functions in the python standard library (exponent, sine, cosine, tangent, log, etc), inequalities (less than, greater than, less or equal, greater or equal, equal, not equal) and logical connectives (AND, OR, NOT, IMPLIES).

Temporal formulas may also be concerned with the aspect of time. For example, requirements such as "Always stay in your lane" (in contrast with "stay in your lane at this moment"), or "Eventually stop at the upcoming stop sign", or "maintain a constant velocity until the driver issues a brake signal" have a temporal component to them. Static formulas may provide a value of true or false at each time step, but the temporal formulas produce a single value of true or false for the entire trace over which they apply.

The example of the ALWAYS construct, above may be written in STL as "ALWAYS ((left_boundary<car_positition−0.1) AND (car_position+ 0.1>right_boundary))". To check this formula, the interpreter first evaluates the internal requirement without the temporal operator, and produces a sequences of TRUE-FALSE values at each time step. Then, the ALWAYS portion returns TRUE if and only if all of the values it sees are TRUE, otherwise returns false. Similarly, the EVENTUALLY operator returns true if it sees a TRUE at some point, otherwise FALSE. The UNTIL operator takes two arguments, one that is true at first, and then another that becomes true when the first becomes false, and so it looks for that pattern in the trace it is given.

Embodiments may be implemented that do not generate an executable for each separate requirement, but use a general-purpose interpreter that is able to execute any given requirement. This is a similar distinction to the difference between "interpreted" and "compiled" programming languages. For example, compiled languages like C++ produce a standalone executable for each program, interpreted languages have a single interpreter executable that interprets and runs any given program. Embodiments may be implemented to generate an executable.

In this example, the trace specifications and the requirements are both implemented as first-class objects. Because the executables can be generated from the natural language requirements, this requirement system can be configured to manage sampling rates and filtering requirements explicitly. This can be used to avoid a situation in which aggressive noise filters might be added that would otherwise dampen out information needed to evaluate behavior.

As noted above, conventional testing and validation processes include requirements in a natural language for which a human designer manually writes tests that they believe will exercise those requirements. This can create a very broad range of items a designer needs to test for, from data integrity (e.g., units, appropriate sampling) to timing and functional capabilities. The requirement itself does not exist as an actual software entity that can be run, the designer needs to imagine different tests that could be run, and may forget. In contrast, embodiments implement the requirement itself as a software entity. As such, it is executable by an appropriate interpreter, and it may be expressed in its entirety in a source file, so it can be managed by a version control system such as a git. This enables tracking of requirements and changes to the requirements with the same tools that are used to keep track of software. Executable, first-class requirements can also be given unit tests: examples of executions traces that they should flag as erroneous, as well as examples of cases that they should deem correct.

With continued reference to FIG. 2, this example includes a plurality of sub requirements 168 that exist as part of the main requirement 160. The sub requirements may also include the same features as main requirement 160, including their own ID, name, natural language description, trace specifications and executable instructions. Sub requirements 168 may be related to their respective parent requirement 160 and can be thought of in some embodiments as a top-level requirement and corresponding low-level requirements. For example, a requirement might state that the vehicle should never come to a complete stop on a freeway. Sub requirements relating to this main requirement might specify ranges of speed (e.g., stop-and-go-traffic speeds) or special circumstances (e.g., accident or Lane blockage) in which it is acceptable to come to a complete stop on a freeway.

Embodiments may further include systems and methods for testing to evaluate whether a system under test is performing according to specification.

Figure 3:
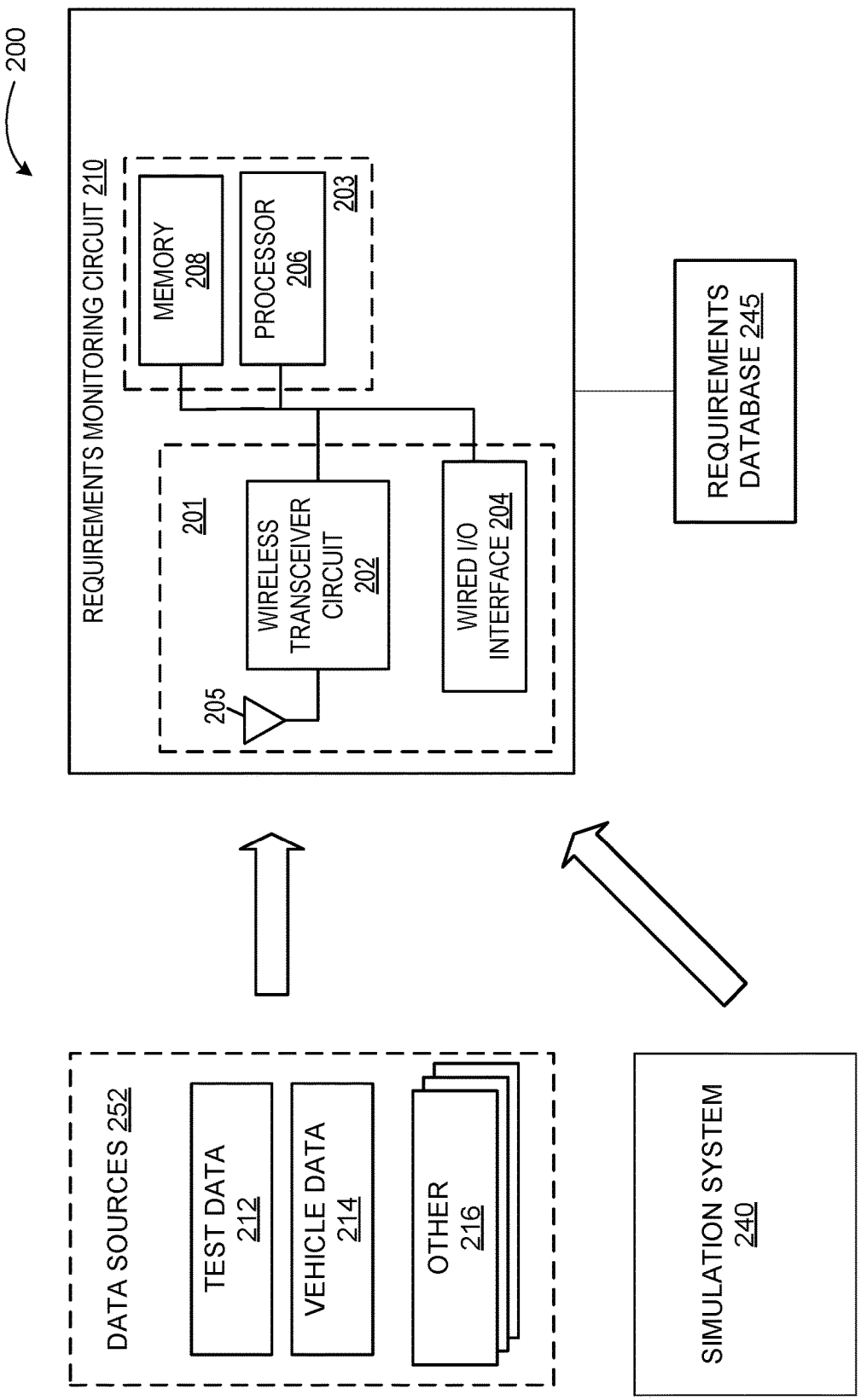
FIG. 3 illustrates an example architecture for requirements monitoring in accordance with embodiments of the systems and methods described herein.

FIG. 3 illustrates an example architecture for requirements monitoring in accordance with embodiments of the systems and methods described herein. Referring now to FIG. 3, in this example, requirements monitoring system 200 includes a requirements monitoring circuit 210, a plurality of data sources 252 a simulation system 240 and a requirements database 245. Data sources 252 simulation system 240 and requirements database 245 can communicate with requirements monitoring circuit 210 via a wired or wireless communication interface. Although data sources 252 simulation system 240 and requirements database 245 are depicted as communicating with requirements monitoring circuit 210, they can also communicate with each other as well as with other vehicle systems. Despite the depiction of arrows, communications may be two-way.

Requirements monitoring circuit 210 in this example includes a communication circuit 201, a processing circuit 203 (including a processor 206 and memory 208 in this example) and a power supply 212. Components of requirements monitoring circuit 210 are illustrated as communicating with each other via a data bus, although other communication in interfaces can be included.

Processor 206 can include one or more GPUs, CPUs, microprocessors, or any other suitable processing system. Processor 206 may include a single core or multicore processors. The memory 208 may include one or more various forms of memory or data storage (e.g., flash, RAM, etc.) that may be used to store the calibration parameters, images (analysis or historic), point parameters, instructions and variables for processor 206 as well as any other suitable information. Memory 208, can be made up of one or more modules of one or more different types of memory, and may be configured to store data and other information as well as operational instructions that may be used by the processor 206 to requirements monitoring circuit 210.

Although the example of FIG. 2 is illustrated using processor and memory circuitry, as described below with reference to circuits disclosed herein, decision circuit 203 can be implemented utilizing any form of circuitry including, for example, hardware, software, or a combination thereof. By way of further example, one or more processors, controllers, ASICs, PLAs, PALs, CPLDs, FPGAs, logical components, software routines or other mechanisms might be implemented to make up a requirements monitoring circuit 210.

Communication circuit 201 either or both a wireless transceiver circuit 202 with an associated antenna 214 and a wired I/O interface 204 with an associated hardwired data port (not illustrated). As this example illustrates, communications with requirements monitoring circuit 210 can include either or both wired and wireless communications circuits 201. Wireless transceiver circuit 202 can include a transmitter and a receiver (not shown) to allow wireless communications via any of a number of communication protocols such as, for example, WiFi, Bluetooth, near field communications (NFC), Zigbee, and any of a number of other wireless communication protocols whether standardized, proprietary, open, point-to-point, networked or otherwise. Antenna 214 is coupled to wireless transceiver circuit 202 and is used by wireless transceiver circuit 202 to transmit radio signals wirelessly to wireless equipment with which it is connected and to receive radio signals as well. These RF signals can include information of almost any sort that is sent or received by requirements monitoring circuit 210 to/from other entities such as data sources 252 and vehicle systems 158.

Wired I/O interface 204 can include a transmitter and a receiver (not shown) for hardwired communications with other devices. For example, wired I/O interface 204 can provide a hardwired interface to other components, including data sources 252 and vehicle systems 158. Wired I/O interface 204 can communicate with other devices using Ethernet or any of a number of other wired communication protocols whether standardized, proprietary, open, point-to-point, networked or otherwise.

Power supply 210 can include one or more of a battery or batteries (such as, e.g., Li-ion, Li-Polymer, NiMH, NiCd, NiZn, and NiH$_2$, to name a few, whether rechargeable or primary batteries), a power connector (e.g., to connect to vehicle supplied power, etc.), an energy harvester (e.g., solar cells, piezoelectric system, etc.), or it can include any other suitable power supply.

Data sources 252 can include, for example, test data 212, vehicle data 214 and other data 216. Test data 212 can be data collected, for example, during testing of a vehicle such as, for example, during a simulation, during prototyping, or during test runs. Vehicle data 214 may also be collected during testing/simulation, prototyping or test runs. Vehicle data 214 can include additional vehicle parameters that may be useful for interpreting test data to 12 or otherwise monitoring the performance of one or more requirements of a set of requirements.

Requirements may be stored in a requirements database 245 for access by requirements monitoring circuit 210. Requirements database 245 may also be accessed by other entities such as, for example, simulation system 240 as well as vehicles under test. Requirements database 245 may be a part of memory 208 or may be a separate data storage environment.

Simulation system 240 may be implemented as a conventional simulator to simulate performance of an ego vehicle in a simulated operational environment. This can include, for example, simulating, evaluating and testing the performance of the ego vehicle in the presence of active agents (e.g., other vehicles, bicycles, pedestrians, etc.) fixed objects (e.g., trees, polls, buildings, lane markings or other objects in the environment, etc), and infrastructure elements (e.g., traffic lights, stop signs, access points etc.). The simulation system 240 may also serve as a data source to the extent that it may provide test data to requirements monitoring circuit 210, which can be used, for example, to monitor requirements.

During operation, requirements monitoring circuit 210 can receive information from the data sources and use this information to determine requirements performance parameters such as, for example, the robustness of requirements and requirements contradictions. Requirements monitoring circuit 210 can use this information to, for example, update the requirements set. Updating requirements that may include, for example, deleting undesirable requirements, adding new requirements, or modifying existing requirements.

Figure 4:
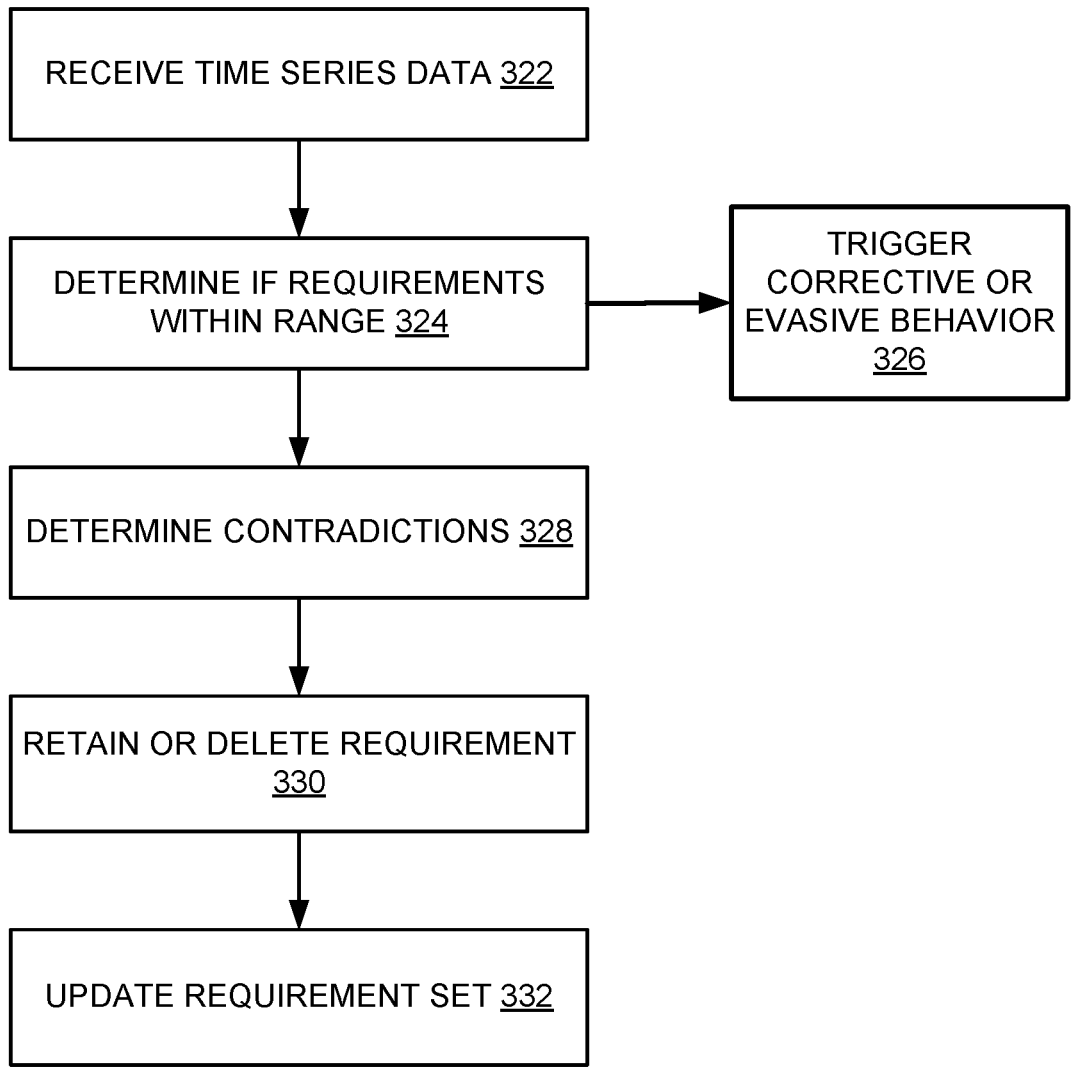
FIG. 4 illustrates an example process for requirements monitoring in accordance with embodiments of the systems and methods disclosed herein.

FIG. 4 illustrates an example process for requirements monitoring in accordance with embodiments of the systems and methods disclosed herein. Referring now to FIG. 4, at operation 322 the requirements monitoring system (e.g., requirements monitoring system 200) receives data from the various data sources. In some embodiments, the data can be time series data provided as a series of data points indexed or listed in chronological order. The time series data can represent a sequence of events or measurements captured by data points temporally spaced (regularly or irregularly) over a given period of time. For example, timeseries data can represent snapshots of data captured at given time intervals such as vehicle speed, following distance, distances from lane markings, acceleration, braking, roll/pitch/yaw, steering angle, and so on. As noted above, the data received may come from a simulation system, a test vehicle, an operational vehicle or other data sources.

At operation 324 a requirement monitoring module evaluates performance based on requirements. This can be characterized, for example, as a robustness of the system based on performance against the various requirements. For example, the robustness can be measured as a percentage of performance against the specified requirement. Consider, for example, following distance behind a lead vehicle. In this scenario a requirement may specify that the ego vehicle remain a certain distance behind a lead vehicle, and this distance may vary based on factors such as vehicle speed, vehicle braking capabilities, traffic conditions, weather conditions, etc. The robustness may measure the extent to which the ego vehicle was able to maintain this specified vehicle separation. For example, a robustness measure may indicate that the ego vehicle was able to maintain separation within a certain percentage of the specified separation requirement. In another scenario, a requirement might specify a particular vehicle speed based on various factors such as speed limit, traffic conditions, weather conditions, etc. The extent to which the subject vehicle was able to meet this vehicle-speed requirement (e.g., it was within x % of the speed requirement) is indicative of the robustness.

Accordingly, the system can be configured to execute the various requirements in the form of monitors that monitor the system based on the received data. The system can be configured in this way to evaluate data (e.g. time series data) to determine whether the requirements are being met, and to what extent each requirement is being met over time. Accordingly, the system can provide a quantitative metric of the degree of safety of a given situation and, as illustrated at step 326, trigger corrective or evasive behaviors if necessary. The requirements can be run off-line using off-line traces from test or simulation data to detect violations or failures in robustness. Robustness semantics of STL can be used to quantify how well the requirement was satisfied.

Figure 5:
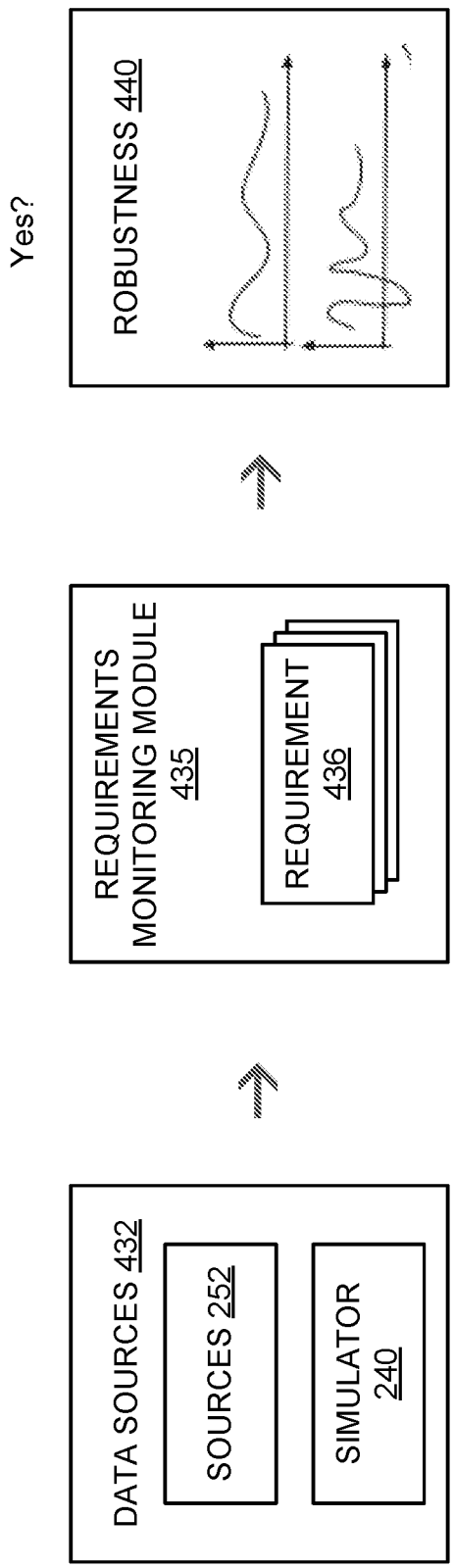
FIG. 5 illustrates an example of using a requirements set to monitor system performance or behavior based on conformance.

FIG. 5 illustrates an example of using a requirements set to monitor system performance or behavior based on conformance. In this example, data is received from a variety of data sources 432 which might include, for example, data sources such as data sources 252 and simulation system 240 from FIG. 3. As noted above, this can be time series data logged with timestamps or other temporal information, and it can include vehicle performance as well as external factors such as, for example, agent behavior, environmental conditions, infrastructure states, and so on. The data can also include vehicle capabilities such as, for example, vehicle steering, braking and acceleration capabilities, and vehicle performance envelopes. Embodiments may also include capability to process real-time vehicle settings such as, for example, drive modes (e.g., Sport+, Sport, Comfort, Eco-mode, etc), suspension settings (for vehicles equipped with adjustable suspension), and so on.

A requirements monitor module 435 includes a plurality of requirements monitors 436 corresponding to the set of requirements for the subject vehicle. Embodiments may include monitors corresponding to requirements 160 or in other forms. Requirement monitors can measure performance against behaviors specified in requirements (e.g., trace specifications 164) and sub requirements (e.g., sub requirements 168). As noted above with reference to operation 324, a requirement monitoring module may evaluate performance of the vehicle relative to the specified set of requirements. As also noted above, this can include checking conformance to the corresponding requirements to determine whether and to what extent the subject vehicle is able to perform in accordance with each of the included requirements. This can be computed in the form of a robustness 440. In the example illustrated in FIG. 5, the robustness is illustrated as score that varies temporally.

Returning now to FIG. 4, if the subject vehicle fails in terms of robustness with respect to one or more of the applicable requirements, refinements can be made to mitigate the issue. Particularly, in various applications robustness reports can be generated and provided to engineering so that engineering can refine or otherwise redesign one or more vehicle systems to improve performance relative to their relevant requirements. In some instances, it may be appropriate to refine the requirements because they may be, for example, too stringent or they have not fully contemplated all of the possible circumstances.

Continuing with FIG. 4, at operation 328 the requirement monitoring module may determine whether there are contradictions among requirements. For example, a requirement to never change lanes might contradict with a requirement not to strike a pedestrian if that pedestrian happens to be in the subject vehicle's lane. This can be accomplished by using the same requirements module throughout the overall autonomous stack so that the system can check for contradictions between requirements of different modules as well as conformance between higher-level and lower-level requirements.

Figure 6:
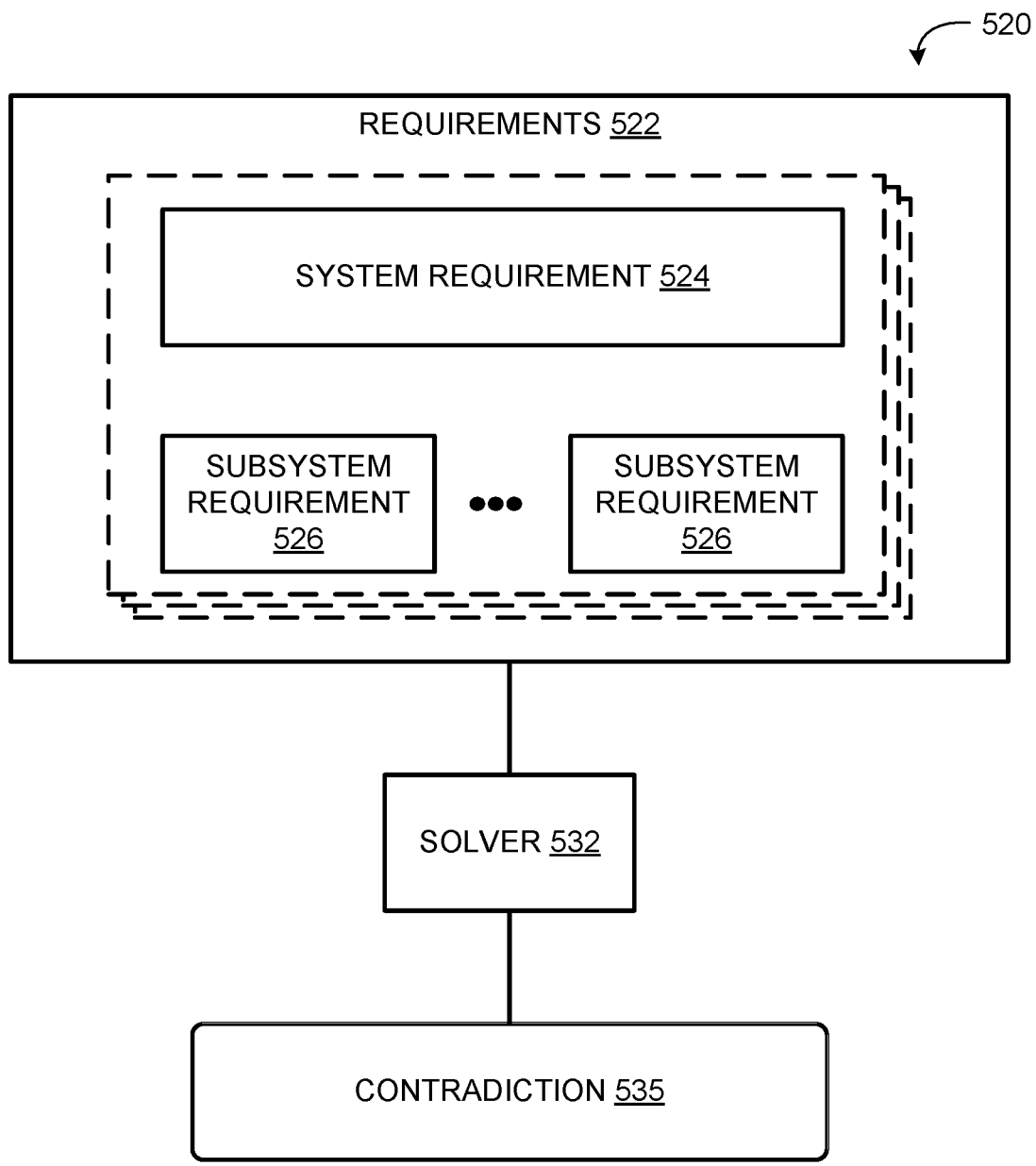
FIG. 6 illustrates an example system for determining requirements contradictions in accordance with various embodiments of the systems and methods described herein.

FIG. 6 illustrates an example system for determining requirements contradictions in accordance with various embodiments of the systems and methods described herein. This example includes a conflict conformance module 520, which includes a solver module 532 to determine conflicts among a plurality of requirements 522. Requirements may include system-level requirements 524 and subsystem-level requirements 526. In this example, conflict conformance module 520 can be configured to output one or more contradictions 535. Contradictions may exist, for example, where a requirement cannot be satisfied without conflicting with another requirement or sub requirement. For example, assume a requirement exists requiring the vehicle to turn on its turn signal if it is going to make a right turn; and another requirement that says if the vehicle just completed a merge to the right or a right turn, the vehicle should wait a determine period of time before actuating the right turn signal again. Such a series of requirements may be a way to prevent the vehicle from weaving or making too many lane changes and the dwell time before the turn signal can be re-enabled can be set accordingly. However, situations may arise in which the vehicle merged into the right lane and now needs to turn right to follow its route, but cannot turn right because the turn signal can't be enabled due to the built-in dwell time. This is an example of a contradiction. Accordingly a solver module 532 can be used to discover contradictions automatically.

Because STL is a form of logic, embodiments may implement logical tools to automatically find conflicts. To illustrate, consider an example in which a designer accidentally creates the following two conflicting requirements, given first in natural language and then in STL.

Requirement 1, in natural language: "If the vehicle is within 1 meter of an intersection where it intends to turn right, then eventually in the next 2 seconds it will enable the right turn signal", and this requirement needs to see measurements every 1 Hz.

Requirement 2, in natural language: "If the vehicle has recently turned off its turn signal (for example, because it just completed a turn or a lane change), then for the next three seconds, it should keep its turn signal off". The intention of this requirement is that the vehicle should not weave in and out of lanes very frequently.

Conflict, in natural language: Suppose that the vehicle has recently merged into the right lane, and at the end of this merge to the right, it has disabled its turn signal. Right at the end of this merge into the right lane, the vehicle arrived within one meter of the intersection where it will turn right, and now it must enable the turn signal within 2 seconds (in accordance with requirement 1), but it may not enable its blinker until 3 seconds have passed, in accordance with requirement 2. Accordingly, these two requirements are in conflict at least in this circumstance.

Requirement 1 in STL: (distance_to_intersection<1 meter IMPLIES EVENTUALLY_[0,2] (blinker=1))@1 Hz Requirement 2 in STL: ((blinker=1 UNTIL blinker=0) IMPLIES ALWAYS_[0,3] (blinker=0))@1 Hz Assume that the system intends to check to determine whether there is a conflict between (EVENTUALLY_[0,2] (blinker=1))@1 Hz) and (ALWAYS_[0,3] (blinker=0))@1 Hz. Because the sampling rate is 1 Hz, embodiments may construct a "symbolic" signal at every second, with unknown values at each second, blinker(time=0 seconds), blinker(time=1 second), blinker(time=2 seconds), blinker (time=3 seconds). (They are indexed by the time at which they are "triggered", i.e., the time at which the left of the implies became true).

Requirement 1 can be translated into conventional logic as saying that either the zeroth, the first, or the second value must be true, i.e.: (blinker(time=0 seconds)==1) OR (blinker (time=1 second)==1) OR (blinker(time=2 seconds)==1)

Requirement 2 can be translated into conventional logic as saying that all of the values, from the zeroth to the third, must be zero, i.e.: (blinker(time=0 seconds)==0) AND (blinker(time=1 second)==0) AND (blinker(time=2 seconds)==0) AND (blinker(time=3 seconds)==0)

This conflict in this situation may be apparent to a human observer. A logic engine may be provided with any of a variety of algorithms that it could use to check for a contradiction, such as, for example, Resolution, Microsoft's z3 and Toyota's dReal. Regardless of the algorithm, embodiments may be configured to unroll the logical formulas across time over symbolic values of the traces, at the sampling rate prescribed by the requirement itself, and apply the requirement to this symbolic trace. Then, the system may use an off-the-shelf logic solver to see if it is possible to have values that satisfy the constraints. If it is not possible, the logic engine will find a contradiction.

Returning now to FIG. 4, at operation 330, the system can determine whether to retain or delete a requirement based, for example, on contradictions. Then, at operation 332, the requirements that can be updated.

In various embodiments, these operations can be performed across multiple runs and even across test and simulation runs. The system can quantify different levels of satisfaction of requirements between these various runs. This information can be further used to, for example, identify issues with the requirements, issues with the simulation system or test vehicle, and so on.

Figure 7:
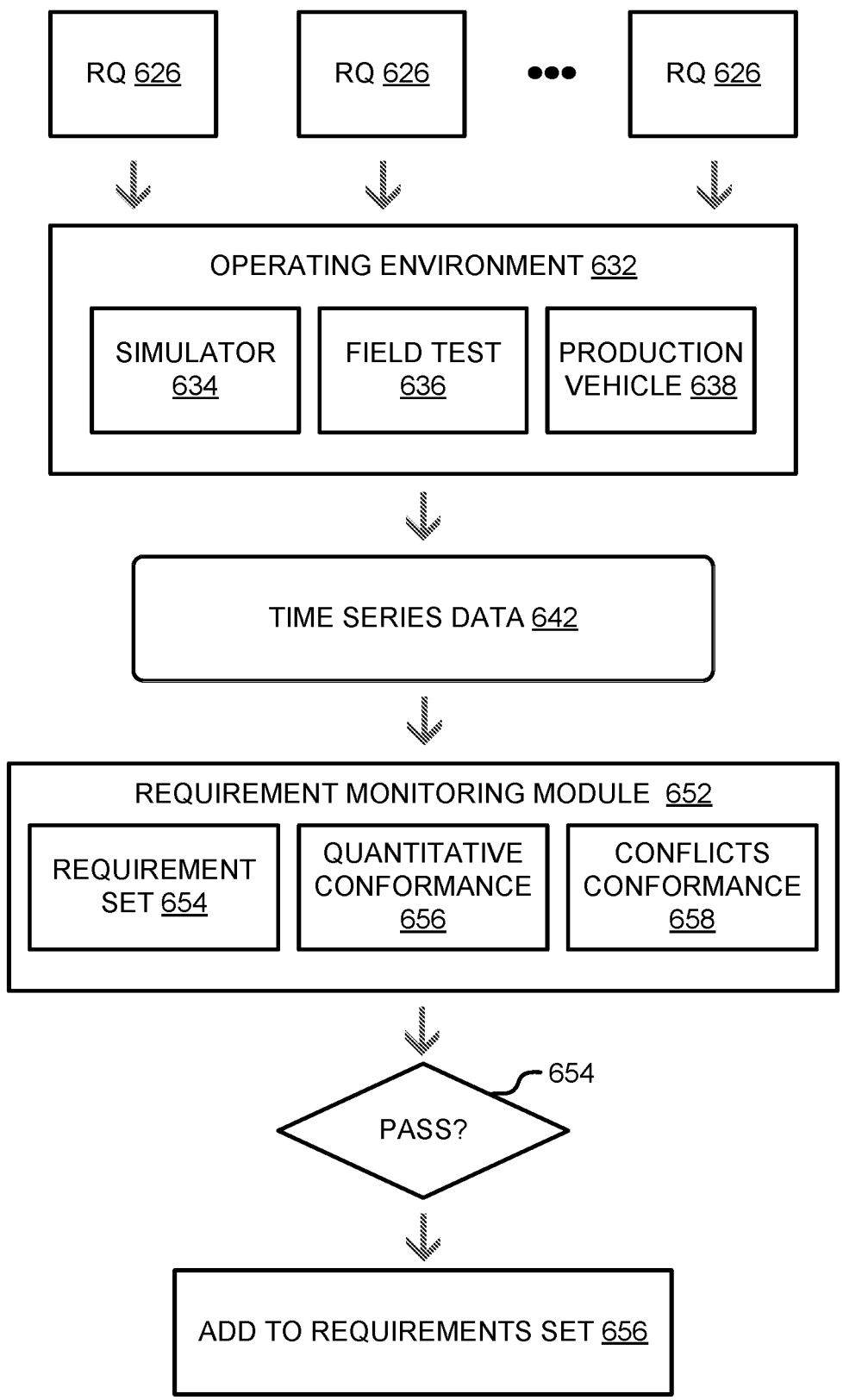
FIG. 7 illustrates an example system for requirements monitoring in accordance with various embodiments of the systems and methods described herein.
Figure 8:
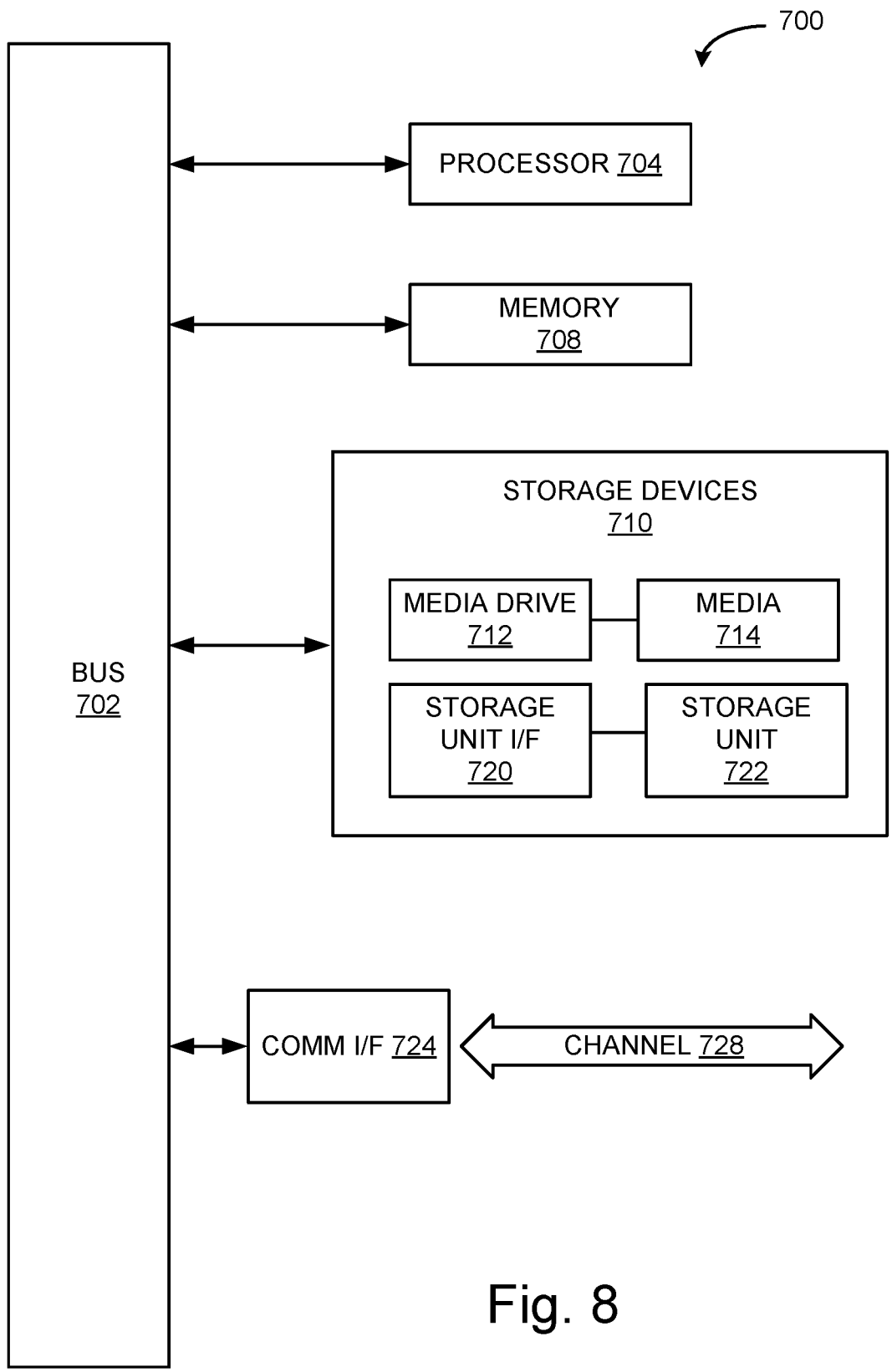
FIG. 8 illustrates an example computing component that may be used to implement various features of embodiments described in the present disclosure.

FIG. 7 illustrates an example system for requirements monitoring in accordance with various embodiments of the systems and methods described herein. As illustrated in the example of FIG. 7, the system includes a plurality of requirements 626 such as a requirement set for a vehicle or platform. These requirements are fed to the subject vehicle or its instantiation within the appropriate component of the operating environment 632. In this example, the operating environment may include one or more of a simulator 634 to simulate operation of the subject vehicle operating in accordance with the set of requirements; a field test 636 to test operation of the vehicle in a test environment; or a production vehicle 638 to allow the production vehicle to operate in accordance with its corresponding set of requirements such as in real-world situations.

Each of these environments is capable of outputting data 642 indicative of performance of the subject vehicle, whether in simulation, testing or real-world situations. As noted above, the output data can be in the form of time series data 642 indicative of vehicle performance. As also noted above, this data can include other information such as, for example, vehicle settings, environmental conditions, behavior of other vehicles in the environment (whether agents in a simulator or actual vehicles in a live test real-world situation), and so on.

This data 642 can be provided to a requirements monitoring module 652. Requirements monitoring module 652 can include a plurality of requirement monitors 654 they can be used to measure vehicle performance against the corresponding requirements. This can be quantified, for example, in terms of robustness or quantitative conformance 656. Likewise, requirements monitoring module 652 can monitor conflict conformance 658 to determine whether there are any conflicts among the various requirements (whether system-level or subsystem-level).

If the requirements pass (operation 654) they can be added to the requirements set at operation 656. If the requirements fail, they can be corrected to resolve the issues that caused the failure. Because the requirements are akin to software objects, new requirements can be pushed out to the appropriate environment such as, for example, the testing environment or the vehicle stack.

As used herein, the terms circuit and component might describe a given unit of functionality that can be performed in accordance with one or more embodiments of the present application. As used herein, a component might be implemented utilizing any form of hardware, software, or a combination thereof. For example, one or more processors, controllers, ASICs, PLAs, PALs, CPLDs, FPGAs, logical components, software routines or other mechanisms might be implemented to make up a component. Various components described herein may be implemented as discrete components or described functions and features can be shared in part or in total among one or more components. In other words, as would be apparent to one of ordinary skill in the art after reading this description, the various features and functionality described herein may be implemented in any given application. They can be implemented in one or more separate or shared components in various combinations and permutations. Although various features or functional elements may be individually described or claimed as separate components, it should be understood that these features/functionality can be shared among one or more common software and hardware elements. Such a description shall not require or imply that separate hardware or software components are used to implement such features or functionality.

Where components are implemented in whole or in part using software, these software elements can be implemented to operate with a computing or processing component capable of carrying out the functionality described with respect thereto. One such example computing component is shown in FIG. 7. Various embodiments are described in terms of this example—computing component 700. After reading this description, it will become apparent to a person skilled in the relevant art how to implement the application using other computing components or architectures.

Referring now to FIG. 7, computing component 700 may represent, for example, computing or processing capabilities found within a self-adjusting display, desktop, laptop, notebook, and tablet computers. They may be found in hand-held computing devices (tablets, PDA's, smart phones, cell phones, palmtops, etc.). They may be found in workstations or other devices with displays, servers, or any other type of special-purpose or general-purpose computing devices as may be desirable or appropriate for a given application or environment. Computing component 700 might also represent computing capabilities embedded within or otherwise available to a given device. For example, a computing component might be found in other electronic devices such as, for example, portable computing devices, and other electronic devices that might include some form of processing capability.

Computing component 700 might include, for example, one or more processors, controllers, control components, or other processing devices. Processor 704 might be implemented using a general-purpose or special-purpose processing engine such as, for example, a microprocessor, controller, or other control logic. Processor 704 may be connected to a bus 702. However, any communication medium can be used to facilitate interaction with other components of computing component 700 or to communicate externally.

Computing component 700 might also include one or more memory components, simply referred to herein as main memory 708. For example, random access memory (RAM) or other dynamic memory, might be used for storing information and instructions to be executed by processor 704. Main memory 708 might also be used for storing temporary variables or other intermediate information during execution of instructions to be executed by processor 704. Computing component 700 might likewise include a read only memory ("ROM") or other static storage device coupled to bus 702 for storing static information and instructions for processor 704.

The computing component 700 might also include one or more various forms of information storage mechanism 710, which might include, for example, a media drive 712 and a storage unit interface 720. The media drive 712 might include a drive or other mechanism to support fixed or removable storage media 714. For example, a hard disk drive, a solid-state drive, a magnetic tape drive, an optical drive, a compact disc (CD) or digital video disc (DVD) drive (R or RW), or other removable or fixed media drive might be provided. Storage media 714 might include, for example, a hard disk, an integrated circuit assembly, magnetic tape, cartridge, optical disk, a CD or DVD. Storage media 714 may be any other fixed or removable medium that is read by, written to or accessed by media drive 712. As these examples illustrate, the storage media 714 can include a computer usable storage medium having stored therein computer software or data.

In alternative embodiments, information storage mechanism 710 might include other similar instrumentalities for allowing computer programs or other instructions or data to be loaded into computing component 700. Such instrumentalities might include, for example, a fixed or removable storage unit 722 and an interface 720. Examples of such storage units 722 and interfaces 720 can include a program cartridge and cartridge interface, a removable memory (for example, a flash memory or other removable memory component) and memory slot. Other examples may include a PCMCIA slot and card, and other fixed or removable storage units 722 and interfaces 720 that allow software and data to be transferred from storage unit 722 to computing component 700.

Computing component 700 might also include a communications interface 724. Communications interface 724 might be used to allow software and data to be transferred between computing component 700 and external devices. Examples of communications interface 724 might include a modem or softmodem, a network interface (such as Ethernet, network interface card, IEEE 802.XX or other interface). Other examples include a communications port (such as for example, a USB port, IR port, RS232 port Bluetooth® interface, or other port), or other communications interface. Software/data transferred via communications interface 724 may be carried on signals, which can be electronic, electromagnetic (which includes optical) or other signals capable of being exchanged by a given communications interface 724. These signals might be provided to communications interface 724 via a channel 728. Channel 728 might carry signals and might be implemented using a wired or wireless communication medium. Some examples of a channel might include a phone line, a cellular link, an RF link, an optical link, a network interface, a local or wide area network, and other wired or wireless communications channels.

In this document, the terms "computer program medium" and "computer usable medium" are used to generally refer to transitory or non-transitory media. Such media may be, e.g., memory 708, storage unit 720, media 714, and channel 728. These and other various forms of computer program media or computer usable media may be involved in carrying one or more sequences of one or more instructions to a processing device for execution. Such instructions embodied on the medium, are generally referred to as "computer program code" or a "computer program product" (which may be grouped in the form of computer programs or other groupings). When executed, such instructions might enable the computing component 700 to perform features or functions of the present application as discussed herein.

It should be understood that the various features, aspects and functionality described in one or more of the individual embodiments are not limited in their applicability to the particular embodiment with which they are described. Instead, they can be applied, alone or in various combinations, to one or more other embodiments, whether or not such embodiments are described and whether or not such features are presented as being a part of a described embodiment. Thus, the breadth and scope of the present application should not be limited by any of the above-described exemplary embodiments.

Terms and phrases used in this document, and variations thereof, unless otherwise expressly stated, should be construed as open ended as opposed to limiting. As examples of the foregoing, the term "including" should be read as meaning "including, without limitation" or the like. The term "example" is used to provide exemplary instances of the item in discussion, not an exhaustive or limiting list thereof. The terms "a" or "an" should be read as meaning "at least one," "one or more" or the like; and adjectives such as "conventional," "traditional," "normal," "standard," "known." Terms of similar meaning should not be construed as limiting the item described to a given time period or to an item available as of a given time. Instead, they should be read to encompass conventional, traditional, normal, or standard technologies that may be available or known now or at any time in the future. Where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "component" does not imply that the aspects or functionality described or claimed as part of the component are all configured in a common package. Indeed, any or all of the various aspects of a component, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A method for requirements engineering, comprising:
receiving as input, time series data from at least one of a simulation of a vehicle run on a simulation system, or from the vehicle in operation;
a requirements monitoring system checking to determine whether a plurality of requirements for operation of the vehicle are met, wherein the requirements are expressed in signal temporal logic form and a requirement includes at least an associated minimal sampling rate and a filtering policy applicable to the requirement;

determining a quantitative conformance for each of selected requirements of the plurality of requirements, wherein the quantitative conformance comprises a non-binary measure that quantifies a degree to which performance is met for the selected requirement; and adding requirements to a verified requirements set based on the quantitative conformance of the requirements.

2. The method of claim 1, wherein the time-series data comprises a sequence of values associated with one or more signals generated and monitored over a period of time.

3. The method of claim 1, wherein the requirements are specified in the form of a requirements model, and wherein a requirement of the plurality of requirements further comprises a system requirement and a subsystem requirement.

4. The method of claim 1, further comprising monitoring the quantitative conformance across a plurality of iterations for the selected requirement to optimize the selected requirement based on the quantitative conformance.

5. The method of claim 1, further comprising determining a conflict conformance for each of the selected requirements of the plurality of requirements, wherein the conflict conformance quantifies a degree to which there is conflict between two or more of the requirements.

6. The method of claim 1, further comprising determining a conflict conformance for each of the selected requirements of the plurality of requirements, wherein the conflict conformance quantifies a degree to which there is conflict between a system requirement and a subsystem requirement.

7. The method of claim 1, further comprising determining a conflict conformance for each of the selected requirements of the plurality of requirements, wherein the conflict conformance quantifies a degree to which there is conflict between two or more of the requirements, and wherein determining a quantitative conformance for selected requirements of the plurality of requirements comprises applying the requirements over time to a symbolic trace and evaluating to determine whether there are values that satisfy the requirements.

8. A system for requirements engineering, comprising:
a processor; and
a memory coupled to the processor to store instructions, which when executed by the processor, cause the processor to perform operations, the operations comprising:
receiving as input, time series data from at least one of a simulation of a vehicle run on a simulation system, or from the vehicle in operation;
a requirements monitoring system checking to determine whether a plurality of requirements for operation of the vehicle are met, wherein the requirements are expressed in signal temporal logic form and a requirement includes at least an associated minimal sampling rate and a filtering policy applicable to the requirement;
determining a quantitative conformance for each of selected requirements of the plurality of requirements, wherein the quantitative conformance comprises a non-binary measure that quantifies a degree to which performance is met for the selected requirement; and
adding requirements to a verified requirements set based on the quantitative conformance of the requirements.

9. The system of claim 8, wherein the time-series data comprises a sequence of values associated with one or more signals generated and monitored over a period of time.

10. The system of claim 8, wherein the requirements are specified in the form of a requirements model, and wherein a requirement of the plurality of requirements further comprises a system requirement and a subsystem requirement.

11. The system of claim 8, wherein the operations further comprise monitoring the quantitative conformance across a plurality of iterations for the selected requirement to optimize the selected requirement based on the quantitative conformance.

12. The system of claim 8, wherein the operations further comprise determining a conflict conformance for each of the selected requirements of the plurality of requirements, wherein the conflict conformance quantifies a degree to which there is conflict between two or more of the requirements.

13. The system of claim 8, wherein the operations further comprise determining a conflict conformance for each of the selected requirements of the plurality of requirements, wherein the conflict conformance quantifies a degree to which there is conflict between a system requirement and a subsystem requirement.

14. The system of claim 8, wherein the operations further comprise determining a conflict conformance for each of the selected requirements of the plurality of requirements, wherein the conflict conformance quantifies a degree to which there is conflict between two or more of the requirements, and wherein determining a quantitative conformance for selected requirements of the plurality of requirements comprises applying the requirements over time to a symbolic trace and evaluating to determine whether there are values that satisfy the requirements.

15. A system for requirements engineering, comprising:
an operating environment, comprising at least one of a simulation system to simulate operation of a vehicle, a prototype vehicle or a production vehicle to generate time series data regarding actual or simulated vehicle performance;
a requirements monitoring module comprising an input to receive time series data from at least one of the simulation system, the prototype vehicle or the actual vehicle; the requirements monitoring module being configured to determine whether a plurality of requirements for operation of the vehicle are met, wherein the requirements are expressed in signal temporal logic form and a requirement includes at least an associated minimal sampling rate and a filtering policy applicable to the requirement; and
a solver module to determine a quantitative conformance for each of selected requirements of the plurality of requirements, wherein the quantitative conformance comprises a non-binary measure that quantifies a degree to which performance is met for the selected requirement.

16. A requirement for vehicle performance, the requirement comprising trace specifications and an executable version of a performance requirement, wherein the executable version of the performance requirement is automatically generated from a natural language description of the requirement.

17. The requirement of claim 16, wherein the trace specifications comprise at least one of a required minimum sampling rate and a filtering specification.

18. The requirement of claim 16, wherein the trace specifications and the requirements are both implemented as first-class objects.

19. The requirement of claim 16, wherein the requirement is implemented as a software entity expressed in a source file that is executable by an interpreter.

20. The system of claim 15, wherein the solver module is further configured to determine a conflict conformance for each of the selected requirements of the plurality of requirements, wherein the conflict conformance quantifies a degree to which there is conflict between two or more of the requirements.

\* \* \* \* \*